(12) United States Patent
    Cho

(10) Patent No.: US 11,227,664 B2
(45) Date of Patent: Jan. 18, 2022

(54) MEMORY DEVICE AND METHOD OF OPERATING THE SAME

(71) Applicant: SK hynix Inc., Gyeonggi-do (KR)

(72) Inventor: Hyun Chul Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/009,128

(22) Filed: Sep. 1, 2020

(65) Prior Publication Data

US 2021/0312993 A1 Oct. 7, 2021

(30) Foreign Application Priority Data

Apr. 7, 2020 (KR) .................. 10-2020-0042382

(51) Int. Cl.
| | |
|---|---|
| *G11C 16/32* | (2006.01) |
| *G11C 16/30* | (2006.01) |
| *G11C 16/26* | (2006.01) |
| *G11C 16/10* | (2006.01) |
| *G11C 16/04* | (2006.01) |

(52) U.S. Cl.
CPC .............. *G11C 16/30* (2013.01); *G11C 16/10* (2013.01); *G11C 16/26* (2013.01); *G11C 16/32* (2013.01); *G11C 16/0483* (2013.01)

(58) Field of Classification Search
CPC ....................................... G11C 16/32
USPC ...................................... 365/185.17
See application file for complete search history.

(56) References Cited

U.S. PATENT DOCUMENTS

2019/0214100 A1* 7/2019 Puthenthermadam ....................... G11C 16/32

FOREIGN PATENT DOCUMENTS

| KR | 10-2001-0061422 | 7/2001 |
| KR | 10-0952235 | 4/2010 |

* cited by examiner

*Primary Examiner* — Jason Lappas
(74) *Attorney, Agent, or Firm* — IP & T Group LLP

(57) ABSTRACT

Provided herein is a memory device and a method of operating the same. The memory device may include a memory block, a voltage generation circuit configured to operate in a first mode in which an operating voltage is generated using an internal voltage or a second mode in which the operating voltage is generated using an external voltage, and to provide the operating voltage to the memory block, and a control logic configured to measure and store a first rising time during which the operating voltage rises to a target level in the first mode, and to control the voltage generation circuit so that a second rising time during which the operating voltage rises to the target level in the second mode is equal to or longer than the first rising time.

27 Claims, 14 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0042382, filed on Apr. 7, 2020, which is incorporated herein by reference in its entirety.

BACKGROUND

1. Field of Invention

Various embodiments of the present disclosure generally relate to a memory device and a method of operating the memory device, and more particularly to a memory device and a method of operating the memory device, which can generate an operating voltage using an external voltage.

2. Description of Related Art

Semiconductor memory devices are memory devices embodied using a semiconductor such as silicon (Si), germanium (Ge), gallium arsenide (GaAs), or indium phosphide (InP). Semiconductor memory devices may be classified into a volatile memory device and a nonvolatile memory device.

The volatile memory device is a memory device in which stored data is lost when power supply is interrupted. Examples of the volatile memory device include a static random access memory (SRAM), a dynamic RAM (DRAM), and a synchronous DRAM (SDRAM). The nonvolatile memory device is a memory device in which stored data is retained even when power supply is interrupted. Examples of the nonvolatile memory device include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). The flash memory is may be classified into a NOR type and a NAND type.

SUMMARY

Various embodiments of the present disclosure are directed to a memory device and a method of operating the memory device, which can improve the reliability of the memory device when an operation of generating an operating voltage using an external voltage is performed.

An embodiment of the present disclosure may provide a memory device. The memory device may include a memory block, a voltage generation circuit configured to operate in a first mode in which an operating voltage is generated using an internal voltage or a second mode in which the operating voltage is generated using an external voltage, and to provide the operating voltage to the memory block, and a control logic configured to measure and store a first rising time during which the operating voltage rises to a target level in the first mode, and to control the voltage generation circuit so that a second rising time during which the operating voltage rises to the target level in the second mode is equal to or longer than the first rising time.

An embodiment of the present disclosure may provide for a method of operating a memory device. The method may include performing a first mode operation of generating an operating voltage using an internal voltage, measuring a first rising time during which the operating voltage rises to a target level, during the first mode operation, performing a second mode operation of generating the operating voltage using an external voltage, measuring a second rising time during which the operating voltage rises to the target level, during the second mode operation, and comparing the first rising time with the second rising time, and maintaining or increasing the second rising time based on a result of the comparison.

An embodiment of the present disclosure may provide for a method of operating a memory device. The method may include performing a first mode operation of generating an operating voltage using an internal voltage, performing a test program operation and a test read operation, during the first mode operation, counting a number of fail bits in first read data that is read as a result of the test read operation and then generating a first fail bit count, during the first mode operation, performing a second mode operation of generating the operating voltage using an external voltage, performing the test program operation and the test read operation, during the second mode operation, counting a number of fail bits in second read data that is read as a result of the test read operation and then generating a second fail bit count, during the second mode operation, and comparing the first fail bit count with the second fail bit count, and adjusting a resistance value of a reception circuit configured to receive the external voltage in the second mode operation based on a result of the comparison.

An embodiment of the present disclosure may provide for a method of operating a memory device. The method may include performing a first test program operation using an internal voltage, measuring a first threshold voltage distribution of memory cells on which the first test program operation has been performed, performing a second test program operation using an external voltage, measuring a second threshold voltage distribution of memory cells on which the second test program operation has been performed, comparing the first threshold voltage distribution with the second threshold voltage distribution, and adjusting a resistance value of a reception circuit configured to receive the external voltage based on a result of the comparison.

DETAILED DESCRIPTION

Advantages and features of the present disclosure, and methods for achieving the same will be described with reference to various embodiments described later in detail together with the accompanying drawings. The present disclosure is not limited to the following embodiments but may be embodied in other forms. These embodiments are provided so that the present disclosure will be thorough and complete, and will fully convey the technical spirit of the disclosure to those skilled in the art.

It is also noted that in this specification, "connected/coupled" refers to one component not only directly coupling another component but also indirectly coupling another component through an intermediate component. In the specification, when an element is referred to as "comprising" or "including" a component, it does not preclude another component but may further include other components unless the context clearly indicates otherwise.

Figure 1:
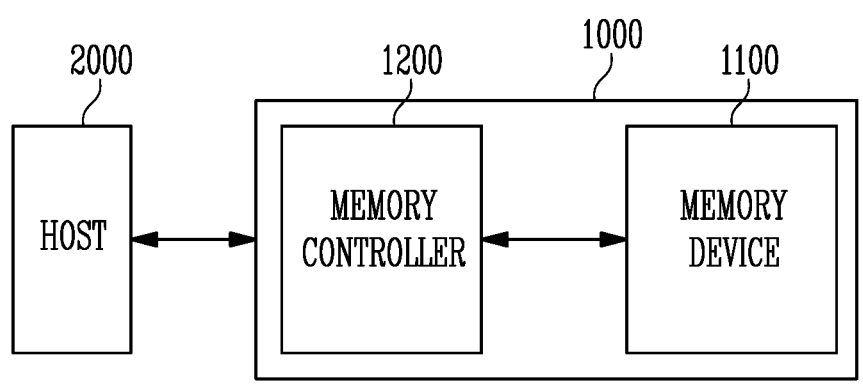
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a memory device 1100 which stores data, and a memory controller 1200 which controls the memory device 1100 under the control of a host 2000.

The host 2000 may communicate with the memory system 1000 using an interface protocol, such as Peripheral Component Interconnect-Express (PCI-E), Advanced Technology Attachment (ATA), Serial ATA (SATA), Parallel ATA (PATA) or Serial Attached SCSI (SAS). In addition, the interface protocol between the host 2000 and the memory system 1000 is not limited to the above-described examples, and may be one of various interface protocols, such as Universal Serial Bus (USB), Multi-Media Card (MMC), Enhanced Small Disk Interface (ESDI), and Integrated Drive Electronics (IDE).

The memory controller 1200 may control the overall operation of the memory system 1000, and may control data exchange between the host 2000 and the memory device 1100. For example, the memory controller 1200 may program or read data by controlling the memory device 1100 in response to a request received from the host 2000. Further, the memory controller 1200 may store information of main memory blocks and sub-memory blocks included in the memory device 1100, and may select the memory device 1100 so that a program operation is performed on a main memory block or a sub-memory block depending on the amount of data loaded for the program operation. In an embodiment, the memory device 1100 may include, for example, a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus DRAM (RDRAM) or a flash memory.

The memory device 1100 may perform a program operation, a read operation, or an erase operation under the control of the memory controller 1200.

Figure 2:
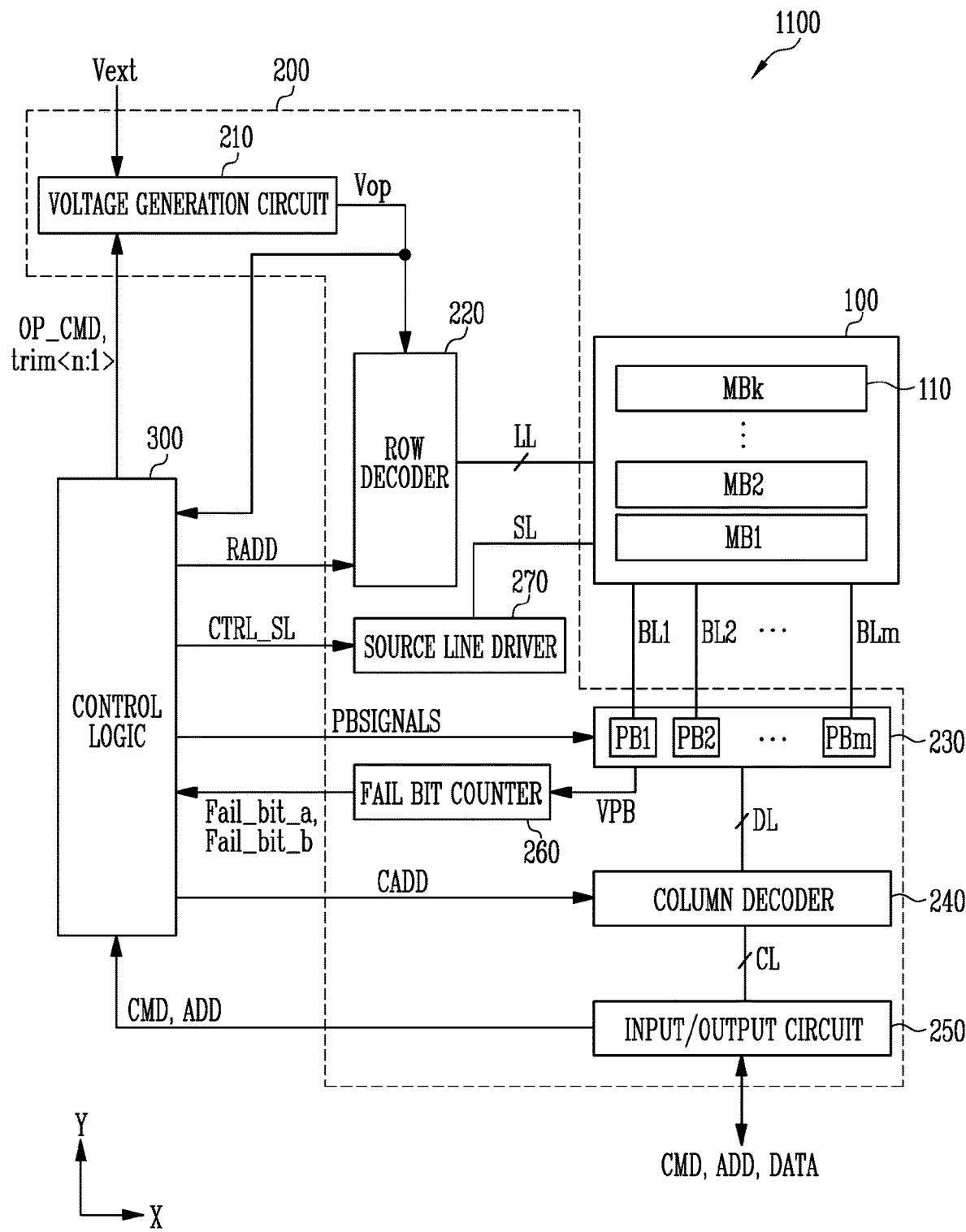
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may include peripheral circuits 200 configured to perform a program operation for storing data in the memory cell array 100, a read operation for outputting the stored data, and an erase operation for erasing the stored data. The memory device 1100 may include a control logic 300 which controls the peripheral circuits 200 under the control of a memory controller (e.g., 1200 of FIG. 1).

The memory cell array 100 may include a plurality of memory blocks MB1 to MBk (where k is a positive integer). For convenience of description, each memory block among the plurality of memory blocks MB1 to MBk may be referred to as memory block 110. Local lines LL and bit lines BL1 to BLm (where m is a positive integer) may be coupled to each memory block 110 among the plurality of memory blocks MB1 to MBk. For example, the local lines LL may include a first select line, a second select line, and a plurality of word lines arranged between the first and second select lines. Also, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines. For example, the local lines LL may further include the dummy lines. For example, the local lines LL may further include pipelines. The local lines LL may be coupled to each memory block 110 among the plurality of memory blocks MB1 to MBk, and the bit lines BL1 to BLm may be coupled in common to the memory blocks MB1 to MBk. The memory blocks MB1 to MBk may each be implemented in a two-dimensional (2D) or three-dimensional (3D) structure. For example, memory cells in the memory blocks 110 having a 2D structure may be arranged in a direction parallel to a substrate. For example, memory cells in the memory blocks 110 having a 3D structure may be vertically stacked on the substrate.

The peripheral circuits 200 may perform program, read, and erase operations on a selected memory block 110 among the memory blocks MB1 to MBk under the control of the control logic 300. For example, the peripheral circuits 200 may read data, stored in memory cells coupled to a selected word line among the word lines, by applying a read voltage to the selected word line and applying a pass voltage to the remaining word lines under the control of the control logic 300. Further, the peripheral circuits 200 may verify the memory cells coupled to a selected word line among the word lines, by applying a verify voltage to the selected word line and applying a pass voltage to the remaining word lines under the control of the control logic 300. Further, the peripheral circuits 200 may perform a test program operation and a test read operation on a selected page of the selected memory block 110 among the memory blocks MB1 to MBk under the control of the control logic 300. The test program operation may be an operation of programming data having a preset pattern to the selected page, and the test read operation may be an operation of reading data stored in the selected page on which the test program has been performed and detecting a fail bit in which a read fail has occurred. During the test read operation, the peripheral circuits 200 may count the number of fail bits, and may transmit the count (i.e., count value) to the control logic 300.

For example, the peripheral circuits 200 may include a voltage generation circuit 210, a row decoder 220, a read/write circuit 230, a column decoder 240, an input/output circuit 250, a fail bit counter 260, and a source line driver 270.

The voltage generation circuit 210 may generate various operating voltages Vop that are used for program, read, and erase operations in response to an operation signal OP_CMD. The voltage generation circuit 210 may generate the operating voltages Vop using an external voltage Vext or using an internal voltage depending on the operation mode. The external voltage Vext may be a supply voltage that is provided from an external voltage supply of a memory system (e.g., 1000 of FIG. 1) through an external voltage pad. The internal voltage may be a supply voltage generated in the memory device 1100.

For example, the voltage generation circuit 210 may generate a program voltage, a verify voltage, pass voltages, a turn-on voltage, a read voltage, a source line voltage, or the like, either using the external voltage Vext or using the internal voltage under the control of the control logic 300.

The row decoder 220 may transfer the operating voltages Vop to the local lines LL coupled to the selected memory block 110 among the memory blocks MB1 to MBk in response to a row address RADD.

The read/write circuit 230 may include a plurality of page buffers PB1 to PBm coupled to the bit lines BL1 to BLm. The page buffers PB1 to PBm may be operated in response to page buffer control signals PBSIGNALS. For example, during a program operation, the page buffers PB1 to PBm may temporarily store data received through data lines DL, and may control the potential levels of the corresponding bit lines BL1 to BLm based on the stored data. Further, during a read or verify operation, the page buffers PB1 to PBm may sense the voltages or currents of the bit lines BL1 to BLm.

The column decoder 240 may transfer data between the input/output circuit 250 and the read/write circuit 230 in response to a column address CADD. For example, the column decoder 240 may exchange data with the page buffers PB1 to PBm through the data lines DL or may exchange data with the input/output circuit 250 through column lines CL.

The input/output circuit 250 may transmit a command CMD and an address ADD, received from the memory controller (e.g., 1200 of FIG. 1), to the control logic 300, or may exchange data DATA with the column decoder 240.

During the test read operation, the fail bit counter 260 may count the number of fail bits by comparing a sensing voltage VPB received from the read/write circuit 230 with a reference voltage, and may then generate a first fail bit count Fail_bit_a or a second fail bit count Fail_bit_b. In an embodiment, the fail bit counter 260 may compare program data that is to be programmed in the test program operation with read data that is read in the test read operation, count the read data different from the program data as a result of the comparison, and then generate the first fail bit count Fail_bit_a or the second fail count Fail_bit_b.

The source line driver 270 may be coupled to memory cells included in the memory cell array 100 through a source line SL, and may control the voltage of a source node. In an example, the source line driver 270 may electrically couple the source node of each memory cell to a ground node during a read or verify operation. Further, the source line driver 270 may apply a ground voltage to the source node of each memory cell during a program operation. The source line driver 270 may apply an erase voltage to the source node of each memory cell during an erase operation. The source line driver 270 may receive a source line control signal CTRL_SL from the control logic 300, and may control the voltage of the source node in response to the source line control signal CTRL_SL.

The control logic 300 may control the peripheral circuits 200 by outputting the operation signal OP_CMD, the row address RADD, the page buffer control signals PBSIGNALS, and the source line control signal CTRL_SL in response to the command CMD and the address ADD.

The control logic 300 may control the voltage generation circuit 210 so that the operating voltages Vop are generated using the external voltage Vext or using the internal voltage during the overall operation of the memory device 1100, such as a program operation, a read operation, or an erase operation.

When each operating voltage Vop is generated using the internal voltage, the control logic 300 may store a rising time during which the operating voltage Vop rises to a target potential (i.e., target level), as a reference rising time. When the operating voltage Vop is generated using the external voltage Vext, the control logic 300 may compare the rising time during which the operating voltage Vop rises to the target potential with the reference rising time, and may generate trim signals trim<n:1> required to adjust the rising time during which the operating voltage Vop rises to the target potential based on the result of the comparison.

In an embodiment, the control logic 300 may control the peripheral circuits 200 so that the test program operation and the test read operation are performed based on the internal voltage, and may store a first fail bit count Fail_bit_a that is detected after the test read operation. The control logic 300 may control the peripheral circuits 200 so that the test program operation and the test read operation are performed based on the external voltage Vext, and may compare a second fail bit count Fail_bit_b that is detected after the test read operation with the first fail bit count Fail_bit_a. The control logic 300 may generate the trim signals trim<n:1> required to adjust the rising time during which the operating voltage Vop rises to the target potential, based on a result of the comparison between the second fail bit count Fail_bit_b and the first fail bit count Fail_bit_a.

Figure 3:
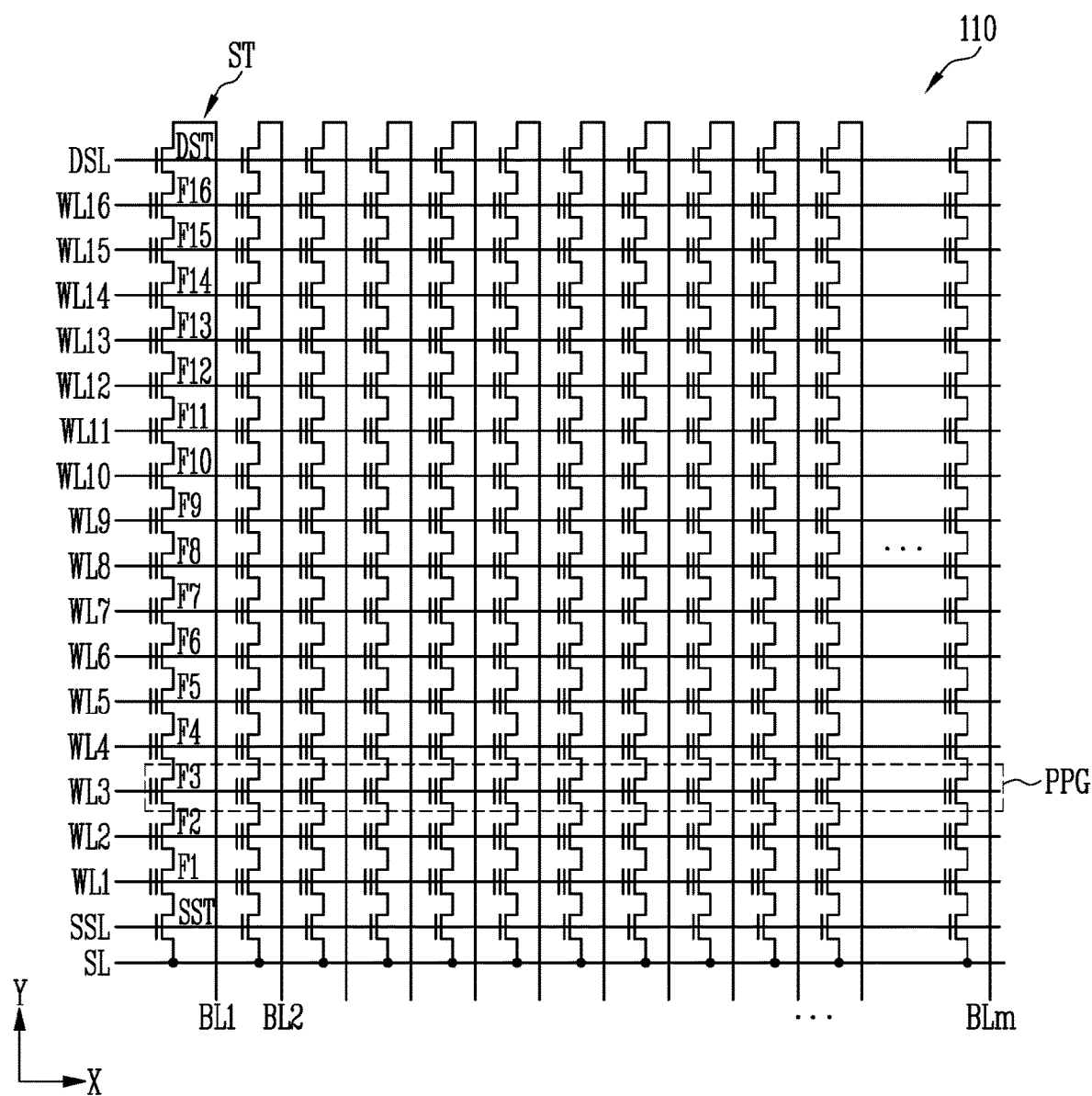
FIG. 3 is a diagram illustrating a memory block of FIG. 2.

FIG. 3 is a diagram illustrating a memory block, for example, a memory block 110 among the memory blocks MB1 to MBk of FIG. 2.

Referring to FIG. 3, the memory block 110 may be configured such that a plurality of word lines, which are arranged in parallel, are coupled between a first select line and a second select line. Here, the first select line may be a source select line SSL and the second select line may be a drain select line DSL. In detail, the memory block 110 may include a plurality of strings ST coupled between bit lines BL1 to BLm and a source line SL. The bit lines BL1 to BLm may be respectively coupled to the strings ST, and the source line SL may be coupled in common to the strings ST. Since the strings ST may have the same configuration, a string ST coupled to the first bit line BL1 will be described in detail by way of example.

The string ST may include a source select transistor SST, a plurality of memory cells F1 to F16, and a drain select transistor DST, which are connected in series between the source line SL and the first bit line BL1. One string ST may include one or more source select transistors SST and drain select transistors DST, and may include more memory cells than the memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells coupled to the same word line, among the memory cells included in different strings ST, may be referred to as a "physical page PPG." Therefore, a number of physical pages PPG that are identical to the number of word lines WL1 to WL16 may be included in the memory block 110.

One memory cell may store one bit of data. This is typically referred to as a "single-level cell (SLC)." In this case, one physical page PPG may store data corresponding to one logical page LPG. The data corresponding to one logical page LPG may include a number of data bits identical to the number of cells included in one physical page PPG. Further, one memory cell may store two or more bits of data. This cell is typically referred to as a "multi-level cell (MLC)". Here, one physical page PPG may store data corresponding to two or more logical pages LPG.

Figure 4:
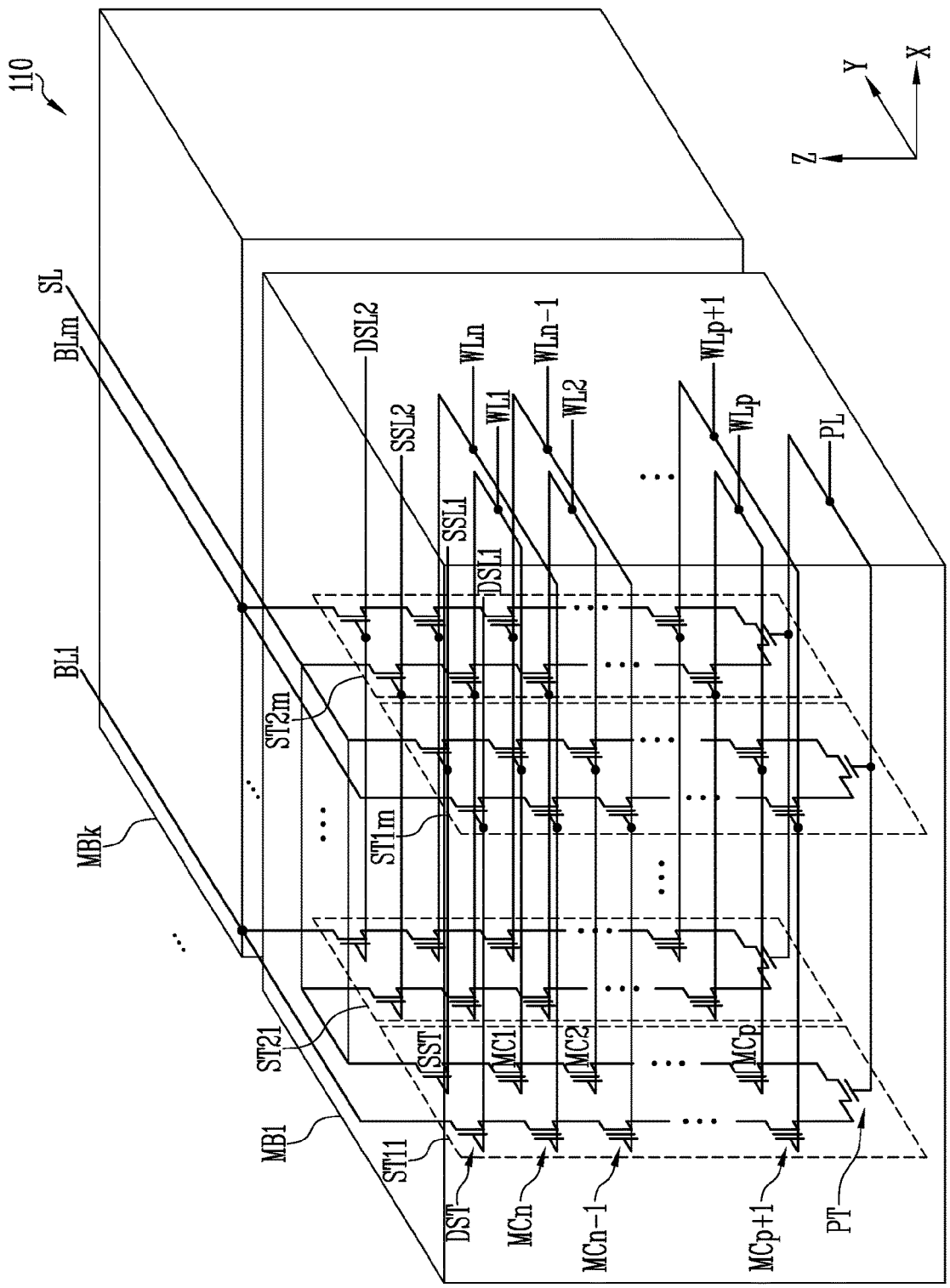
FIG. 4 is a diagram illustrating an example of a memory block having a three-dimensional (3D) structure.

FIG. 4 is a diagram illustrating an example of a memory block, for example, a memory block 110 among the memory blocks MB1 to MBk of FIG. 2 having a three-dimensional (3D) structure.

Referring to FIG. 4, the memory cell array 100 may include a plurality of memory blocks MB1 to MBk. Each memory block 110 among the plurality of memory blocks MB1 to MBk may include a plurality of strings ST11 to ST1$m$ and ST21 to ST2$m$. In an embodiment, each of the strings ST11 to ST1$m$ and ST21 to ST2$m$ may be formed in a 'U' shape. In the first memory block MB1, m strings may be arranged in a row direction (e.g., X direction). Although, in FIG. 4, two strings are illustrated as being arranged in a column direction (e.g., Y direction), this embodiment is given for convenience of description, and three or more strings may be arranged in the column direction (e.g., Y direction) in other embodiments.

Each of the plurality of strings ST11 to ST1$m$ and ST21 to ST2$m$ may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layer, the tunnel insulating layer, the charge trap layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, the source select transistors of the strings ST11 to ST1$m$ in a first row may be coupled to a first source select line SSL1. The source select transistors of the strings ST21 to ST2$m$ in a second row may be coupled to a second source select line SSL2.

In other embodiments, the source select transistors of the strings ST11 to ST1$m$ and ST21 to ST2$m$ may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (e.g., Z direction), and may be coupled in series between the source select transistor SST and the pipe transistor PT. The p+1-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1$m$ in the first row may be coupled to a drain select line DSL1. The drain select transistors of the strings ST21 to ST2$m$ in the second row may be coupled to a second drain select line DSL2.

The strings arranged in the column direction may be coupled to bit lines extending in the column direction. In FIG. 4, the strings ST11 and ST21 in a first column may be coupled to a first bit line BL1. The strings ST1$m$ and ST2$m$ in an m-th column may be coupled to an m-th bit line BLm.

Among strings arranged in the row direction, memory cells coupled to the same word line may constitute one page. For example, memory cells coupled to the first word line WL1, among the strings ST11 to ST1$m$ in the first row, may constitute one page. Among the strings ST21 to ST2$m$ in the second row, memory cells coupled to the first word line WL1 may constitute one additional page. Strings arranged in the direction of a single row may be selected by selecting any one of the drain select lines DSL1 and DSL2. One page may be selected from the selected strings by selecting any one of the word lines WL1 to WLn.

Figure 5:
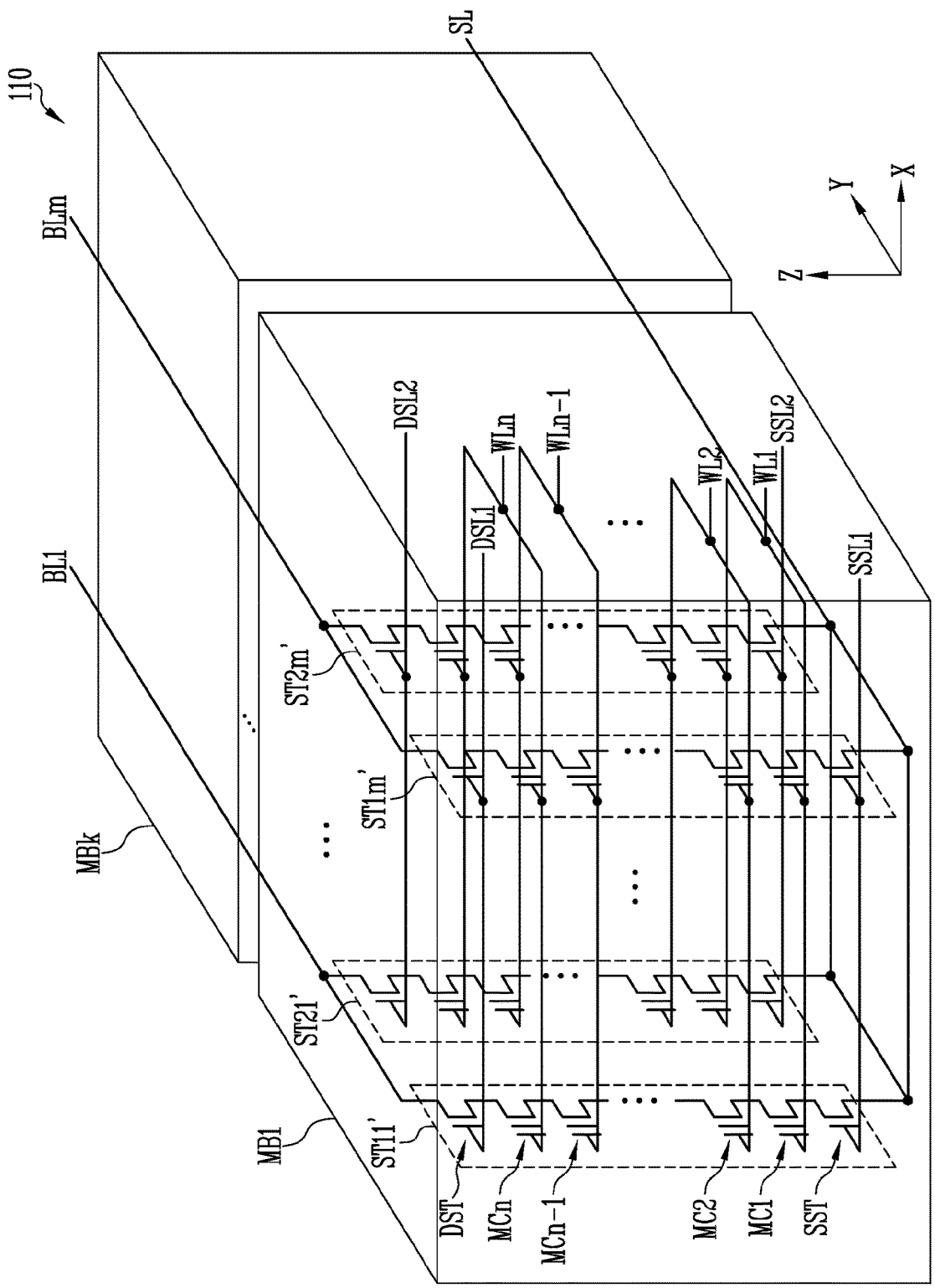
FIG. 5 is a diagram illustrating an example of a memory block having a 3D structure.

FIG. 5 is a diagram illustrating an example of a memory block, for example, a memory block 110 among the memory blocks MB1 to MBk having a 3D structure.

Referring to FIG. 5, the memory cell array 100 may include a plurality of memory blocks MB1 to MBk. Each memory block 110 among the plurality of memory blocks MB1 to MBk may include a plurality of strings ST11' to ST1$m$' and ST21' to ST2$m$'. Each of the strings ST11' to ST1$m$' and ST21' to ST2$m$' may extend along a vertical direction (e.g., Z direction). In the memory block 110, m strings may be arranged in a row direction (e.g., X direction). Although, in FIG. 5, two strings are illustrated as being arranged in a column direction (e.g., Y direction), this embodiment is given for convenience of description, and three or more strings may be arranged in the column direction (e.g., Y direction) in other embodiments.

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thus, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11' to ST1m' in a first row may be coupled to a first drain select line DSL1. The drain select transistors DST of the strings ST21' to ST2m' in a second row may be coupled to a second drain select line DSL2.

That is, the memory block 110 of FIG. 5 may have an equivalent circuit similar to that of the memory block 110 of FIG. 4 except that a pipe transistor PT is excluded from each string.

Figure 6:
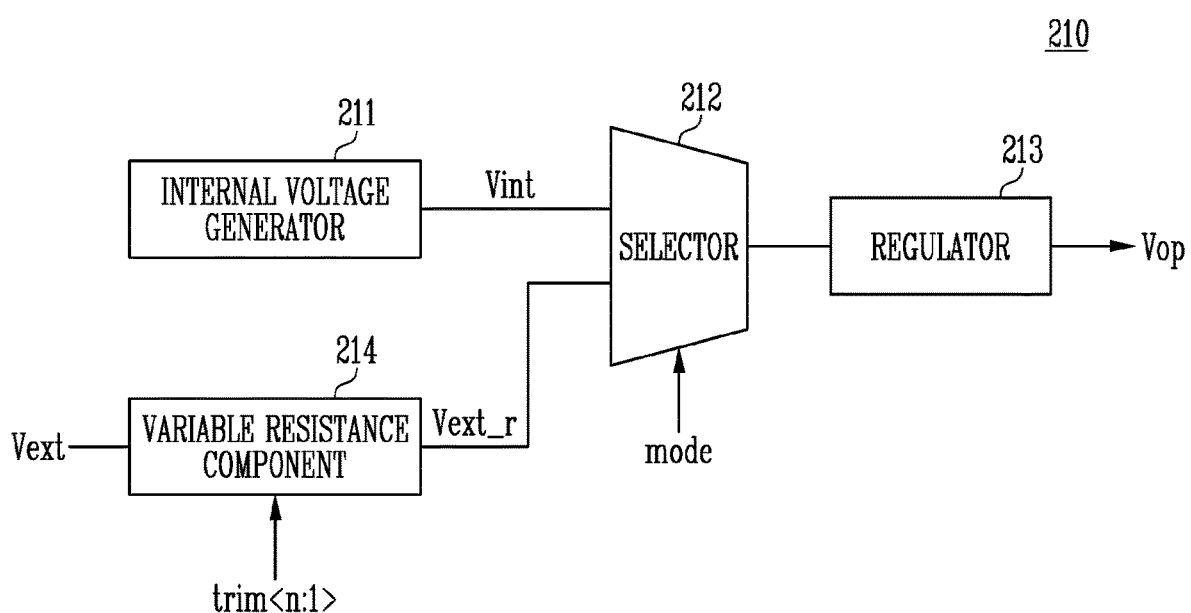
FIG. 6 is a diagram illustrating a voltage generation circuit of FIG. 2.

FIG. 6 is a diagram illustrating the voltage generation circuit of FIG. 2.

Referring to FIG. 6, the voltage generation circuit 210 may include an internal voltage generator 211, a selector 212, a regulator 213, and a variable resistance circuit 214.

The internal voltage generator 211 may generate and output an internal voltage Vint during the overall operation of a memory device.

The variable resistance circuit 214 may receive an external voltage Vext from an external device and output the received external voltage Vext as an input external voltage Vext_r by controlling the amount of current that is supplied depending on a preset resistance value.

The variable resistance circuit 214 may set a resistance value in response to trim signals trim<n:1>.

The selector 212 may output the internal voltage Vint or the input external voltage Vext_r in response to a mode signal (referred to as 'mode' in FIG. 6). For example, when the mode signal corresponds to an operation mode in which an operating voltage Vop is generated using the internal voltage Vint, the selector 212 may selectively output the internal voltage Vint in response to the mode signal. For example, when the mode signal corresponds to an operation mode in which the operating voltage Vop is generated using the external voltage Vext, the selector 212 may selectively output the input external voltage Vext_r in response to the mode signal. The regulator 213 may receive the internal voltage Vint or the input external voltage Vext_r from the selector 212 and then generate and output the operating voltage Vop.

Figure 7:
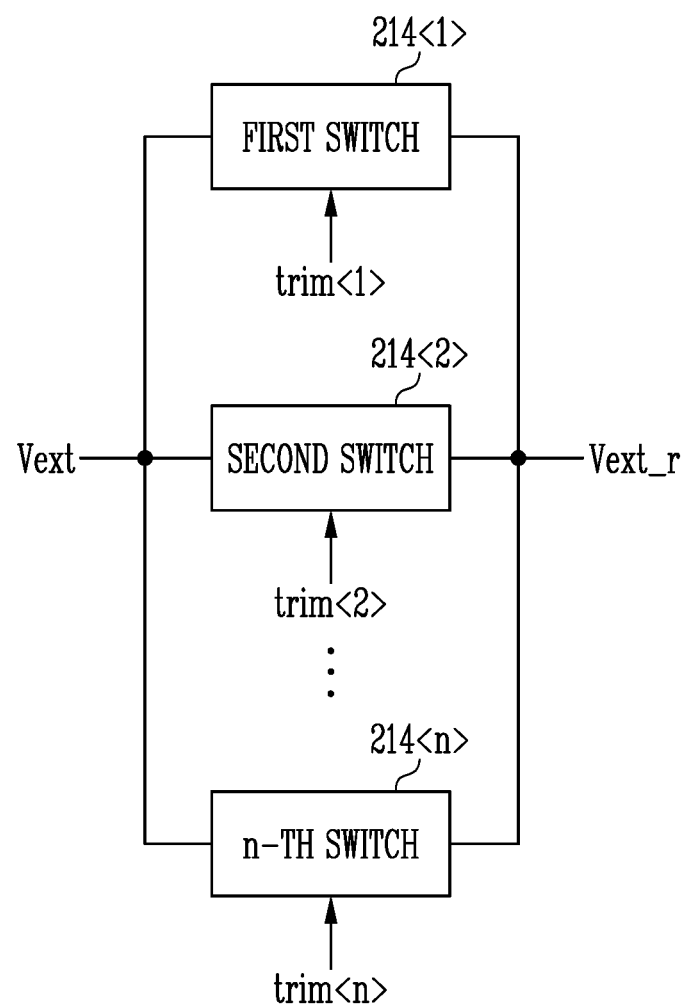
FIG. 7 is a diagram illustrating a variable resistance circuit of FIG. 6.

FIG. 7 is a diagram illustrating the variable resistance circuit of FIG. 6.

Referring to FIG. 7, the variable resistance circuit 214 may include first to n-th switches 214<1> to 214<n>. The first to n-th switches 214<1> to 214<n> may be coupled in parallel between an input terminal for receiving an external voltage Vext and an output terminal for outputting an input external voltage Vext_r. Each of the first to n-th switches 214<1> to 214<n> performs a switching operation in response to any one of trim signals trim<n:1>, and the first to n-th switches 214<1> to 214<n> may have different resistance values, respectively.

Accordingly, the variable resistance circuit 214 may vary a resistance value thereof to a preset resistance value in response to the trim signals trim<n:1>, and may control the amount of current transmitted using the varied resistance value during an operation of switching the external voltage Vext to the input external voltage Vext_r.

Figure 8:
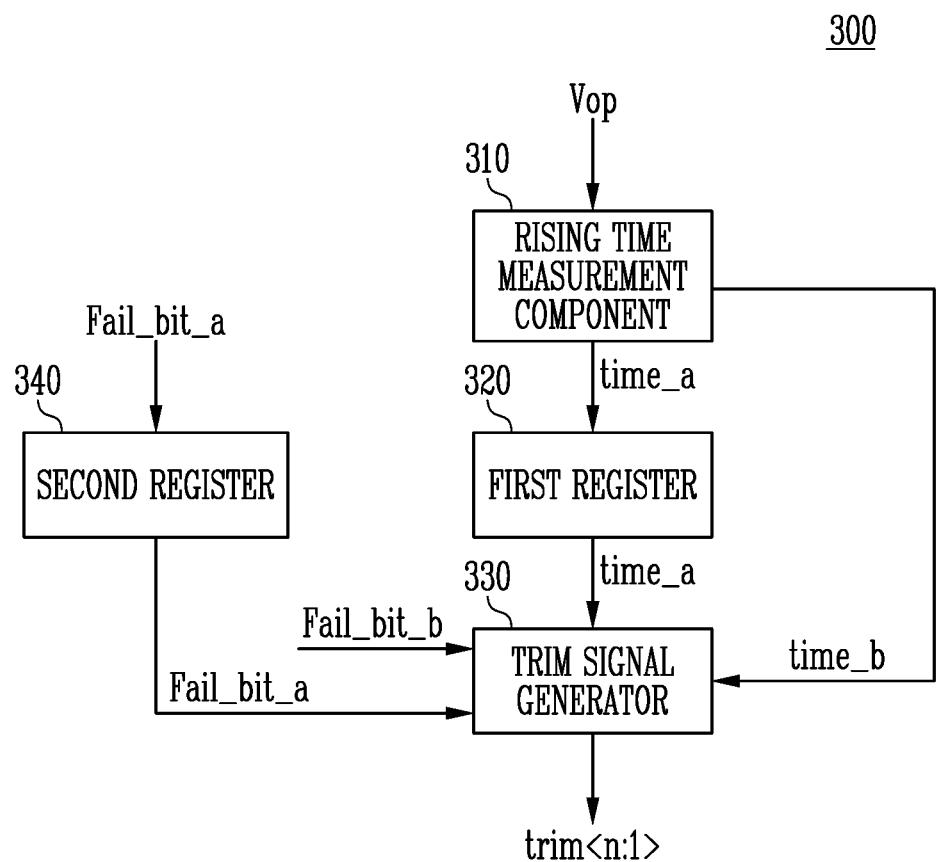
FIG. 8 is a diagram illustrating a control logic of FIG. 2.

FIG. 8 is a diagram illustrating the control logic of FIG. 2.

Referring to FIG. 8, the control logic 300 may include a rising time measurement circuit 310, a first register 320, a trim signal generator 330, and a second register 340.

When an operating voltage Vop is generated using an internal voltage Vint generated by the internal voltage generator 211 of FIG. 6, the rising time measurement circuit 310 may receive the operating voltage Vop, measure a first rising time time_a during which the operating voltage Vop rises to a target potential, and set the first rising time time_a as a reference rising time.

Also, when the operating voltage Vop is generated using the input external voltage Vext_r that is generated by the variable resistance circuit 214 of FIG. 7 receiving the external voltage Vext, the rising time measurement circuit 310 may receive the operating voltage Vop, and may measure and output a second rising time time_b during which the operating voltage Vop rises to the target potential.

The first register 320 may receive the reference rising time time_a from the rising time measurement circuit 310, and may store the reference rising time time_a. The first register 320 may output the stored reference rising time time_a when the operation of generating the operating voltage Vop using the external voltage Vext is performed.

When the operation of generating the operating voltage Vop using the external voltage Vext is performed, the trim signal generator 330 may compare the reference rising time time_a received from the first register 320 with the second rising time time_b received from the rising time measurement circuit 310, and may then generate and output trim signals trim<n:1>.

For example, the trim signal generator 330 may generate the trim signals trim<n:1> based on the difference between the reference rising time time_a and the second rising time time_b, and may generate and output the trim signals trim<n:1> so that, as the second rising time time_b is shorter than the reference rising time time_a, the resistance value of the variable resistance circuit 214 is increased. Moreover, the trim signal generator 330 may generate and output the trim signals trim<n:1> so that, as the second rising time time_b is longer than the reference rising time time_a, the resistance value of the variable resistance circuit 214 is decreased.

The second register 340 may receive and store a first fail bit count Fail_bit_a obtained by counting the number of fail bits after the test program operation and the test read operation have been performed based on the operating voltage Vop that is generated using the internal voltage Vint. The second register 340 may output the first fail bit count Fail_bit_a stored therein after the test program operation and the test read operation have been performed based on the operating voltage Vop that is generated using the external voltage Vext.

The trim signal generator 330 may generate the trim signals trim<n:1> by comparing a second fail bit count Fail_bit_b, which is obtained by counting the number of fail bits after the test program operation and the test read operation have been performed based the operating voltage Vop that is generated using the external voltage Vext, with the first fail bit count Fail_bit_a, which is received from the second register 340. For example, the trim signal generator 330 may generate and output the trim signals trim<n:1> so that, when the second fail bit count Fail_bit_b is greater than the first fail bit count Fail_bit_a, the resistance value of the variable resistance circuit 214 is increased. In contrast, the trim signal generator 330 may generate and output the trim signals trim<n:1> so that, when the second fail bit count Fail_bit_b is less than or equal to the first fail bit count Fail_bit_a, the resistance value of the variable resistance circuit 214 is maintained.

Figure 9:
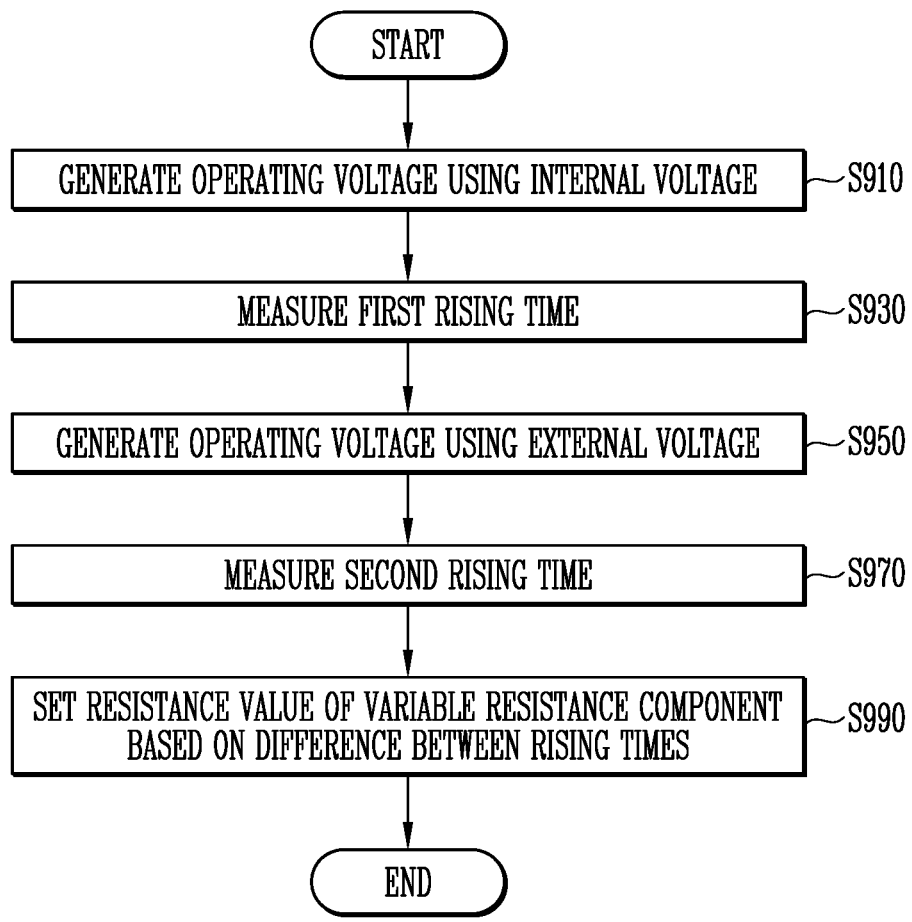
FIG. 9 is a flowchart illustrating a method of operating a memory device according to an embodiment of the present disclosure.

FIG. 9 is a flowchart illustrating a method of operating a memory device according to an embodiment of the present disclosure.

The method of operating a memory device according to an embodiment of the present disclosure will be described with reference to FIGS. 2 to 9.

At operation S910, the control logic 300 may control the voltage generation circuit 210 so that an operation of generating an operating voltage using an internal voltage is performed.

For example, the internal voltage generator 211 of the voltage generation circuit 210 may be activated to generate and output the internal voltage Vint under the control of the control logic 300. The selector 212 may receive the internal voltage Vint from the internal voltage generator 211, and may select the internal voltage Vint and output it to the regulator 213 in response to the mode signal. The regulator 213 may generate the operating voltage Vop using the received internal voltage Vint and output the operating voltage Vop to the row decoder 220. The row decoder 220 is coupled to local lines LL, and the time during which the operating voltage Vop provided to the row decoder 220 rises to a target level is differently required depending on the load value of the local lines LL.

At operation S930, the rising time measurement circuit 310 of the control logic 300 may receive the operating voltage Vop generated by the regulator 213, and may measure a first rising time time_a during which the operating voltage Vop rises to the target level. The first register 320 may receive the first rising time time_a measured by the rising time measurement circuit 310, and may store the first rising time as a reference rising time.

At operation S950, the control logic 300 may control the voltage generation circuit 210 so that an operating voltage generation operation using an external voltage is performed.

For example, the variable resistance circuit 214 of the voltage generation circuit 210 may receive the external voltage Vext through an external pad, and may output an input external voltage Vext_r, generated by controlling the amount of current of the external voltage Vext based on a preset resistance value. The selector 212 may receive the input external voltage Vext_r from the variable resistance circuit 214, and may select the input external voltage Vext_r and then output it to the regulator 213 in response to the mode signal. The regulator 213 may generate the operating voltage Vop using the received input external voltage Vext_r and output the operating voltage Vop to the row decoder 220.

At operation S970, the rising time measurement circuit 310 of the control logic 300 may receive the operating voltage Vop generated by the regulator 213, and may measure a second rising time time_b during which the operating voltage Vop rises to the target level.

At operation S990, the trim signal generator 330 of the control logic 300 compares the reference rising time time_a, received from the first register 320, with the second rising time time_b, received from the rising time measurement circuit 310. The trim signal generator 330 may generate and output trim signals trim<n:1> based on the result of the comparison.

For example, the trim signal generator 330 may generate the trim signals trim<n:1> based on the difference between the reference rising time time_a and the second rising time time_b, and may generate and output the trim signals trim<n:1> so that, as the second rising time time_b is shorter than the reference rising time time_a, the resistance value of the variable resistance circuit 214 is increased. Meanwhile, the trim signal generator 330 may generate and output the trim signals trim<n:1> so that, as the second rising time time_b is longer than the reference rising time time_a, the resistance value of the variable resistance circuit 214 is decreased.

The variable resistance circuit 214 may set a previously set resistance value to a new resistance value in response to the trim signals trim<n:1>.

In an embodiment of the present disclosure, a case where the resistance value of the variable resistance circuit is set by performing operations S950 to S990 is illustrated by way of example, and the second rising time may be controlled such that the second rising time is equal to or longer than the first rising time by re-performing a procedure starting from operation S950 after operation S990.

Accordingly, an operating voltage rising interval, appearing when the operating voltage is generated using the internal voltage, and an operating voltage rising interval, appearing when the operating voltage is generated using the external voltage, are controlled to be similar to each other. Also, the operating characteristics of the memory device may be improved when the overall operation of the memory device is performed using the external voltage.

Figure 10:
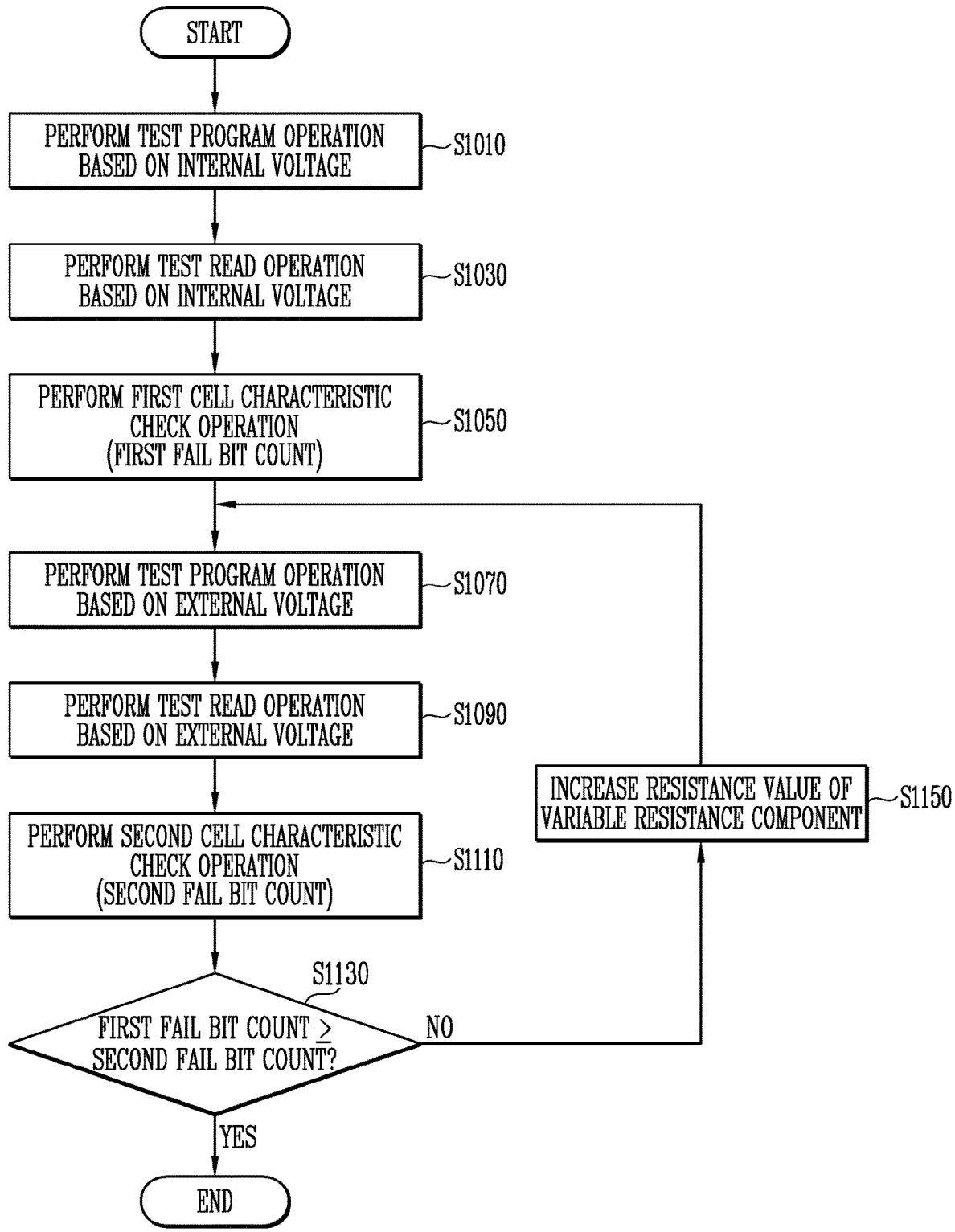
FIG. 10 is a flowchart illustrating a method of operating a memory device according to an embodiment of the present disclosure.

FIG. 10 is a flowchart illustrating a method of operating a memory device according to an embodiment of the present disclosure.

The method of operating a memory device according to the present embodiment of the present disclosure will be described with reference to FIGS. 2 to 8 and 10.

At operation S1010, the control logic 300 may control the peripheral circuits 200 so that a test program operation is performed based on an internal voltage.

For example, the internal voltage generator 211 of the voltage generation circuit 210 may be activated to generate and output the internal voltage Vint under the control of the control logic 300. The selector 212 may receive the internal voltage Vint from the internal voltage generator 211, and may select the internal voltage Vint and output it to the regulator 213 in response to a mode signal. The regulator 213 may generate operating voltages Vop using the received internal voltage Vint and output the operating voltages Vop to the row decoder 220.

During a test program operation, the page buffers PB1 to PBm of the read/write circuit 230 may receive and temporarily store program data having a preset pattern or a random pattern, and may control the potential levels of the corresponding bit lines BL1 to BLm based on the temporarily stored program data.

The row decoder 220 may transfer the operating voltages Vop to the local lines LL coupled to the selected memory block (e.g., MB1) in response to a row address RADD. For example, among the operating voltages Vop, the program voltage may be applied to a selected word line, and the pass voltage may be applied to unselected word lines, and thus the test program operation may be performed.

The test program operation may be performed on at least one page selected from the selected memory block (e.g., MB1).

At operation S1030, the control logic 300 may control the peripheral circuits 200 so that a test program operation is performed based on the internal voltage.

For example, the voltage generation circuit 210 may generate and output the plurality of operating voltages Vop using the internal voltage Vint. The row decoder 220 may transfer the operating voltages Vop to the local lines LL coupled to the selected memory block (e.g., MB1) in response to a row address RADD. For example, among the operating voltages Vop, the read voltage may be applied to a selected word line, and the pass voltage may be applied to unselected word lines, and thus the test read operation may be performed. The word line selected in the test read operation may be identical to the word line selected in the test program operation.

The page buffers PB1 to PBm of the read/write circuit 230 may detect read data by sensing the potential levels or the amounts of current of the bit lines BL1 to BLm during the test read operation. The read/write circuit 230 may generate and output a sensing voltage VPB based on the detected read data.

At operation S1050, a first cell characteristic check operation may be performed based on the result of the test read operation. For example, during the test read operation, the fail bit counter 260 may count the number of fail bits by comparing the sensing voltage VPB received from the read/write circuit 230 with a reference voltage, and may then generate a first fail bit count Fail_bit_a. In an embodiment, the fail bit counter 260 may compare program data that is to be programmed in the test program operation with read data that is read in the test read operation, detect read data different from the program data as a result of the comparison, and then generate the first fail bit count Fail_bit_a. The generated first fail bit count Fail_bit_a may be transmitted to and stored in the second register 340 of the control logic 300.

At operation S1070, the control logic 300 may control the peripheral circuits 200 so that a test program operation is performed based on an external voltage.

For example, the voltage generation circuit 210 may generate the plurality of operating voltages Vop using the external voltage Vext and output the operating voltages Vop.

During a test program operation, the page buffers PB1 to PBm of the read/write circuit 230 may receive and temporarily store program data having a preset pattern or a random pattern, and may control the potential levels of the corresponding bit lines BL1 to BLm based on the temporarily stored program data. The program data at operation S1070 may have the same data pattern as the program data at the above-described operation S1010.

The row decoder 220 may transfer the operating voltages Vop to the local lines LL coupled to the selected memory block (e.g., MB1) in response to a row address RADD. For example, among the operating voltages Vop, the program voltage may be applied to a selected word line, and the pass voltage may be applied to unselected word lines, and thus the test program operation may be performed.

The test program operation may be performed on at least one page selected from the selected memory block (e.g., MB1).

The at least one page selected from the selected memory block at operation S1070 may be the same page as the at least one page selected from the selected memory block at the above-described operation S1010. That is, in an embodiment, the test program operation may be performed at operation S1070 so that the same program data as the test program operation at operation S1010 is programmed to the same page as the test program operation at operation S1010.

At operation S1090, the control logic 300 may control the peripheral circuits 200 so that a test read operation is performed based on the external voltage.

For example, the voltage generation circuit 210 may generate and output the plurality of operating voltages Vop using the external voltage Vext. The row decoder 220 may transfer the operating voltages Vop to the local lines LL coupled to the selected memory block (e.g., MB1) in response to a row address RADD. For example, among the operating voltages Vop, the read voltage may be applied to a selected word line, and the pass voltage may be applied to unselected word lines, and thus the test read operation may be performed. The word line selected in the test read operation may be identical to the word line selected in the test program operation.

The page buffers PB1 to PBm of the read/write circuit 230 may detect read data by sensing the potential levels or amounts of current of the bit lines BL1 to BLm during the test read operation. The read/write circuit 230 may generate and output a sensing voltage VPB based on the detected read data.

At operation S1110, a second cell characteristic check operation may be performed based on the result of the test read operation. For example, during the test read operation, the fail bit counter 260 may generate a second fail bit count Fail_bit_b by comparing the sensing voltage VPB received from the read/write circuit 230 with a reference voltage. In an embodiment, the fail bit counter 260 may compare program data that is to be programmed in the test program operation with read data that is read in the test read operation, detect read data different from the program data as a result of the comparison, and then generate the second fail bit count Fail_bit_b. The second fail bit count Fail_bit_b may be transmitted to the trim signal generator 330 of the control logic 300.

At operation S1130, the trim signal generator 330 of the control logic 300 may compare the second fail bit count Fail_bit_b, received from the fail bit counter 260, with the first fail bit count Fail_bit_a, received from the second register 340.

When, as a result of the comparison at operation S1130, the first fail bit count Fail_bit_a is less than the second fail bit count Fail_bit_b (in case of No), the trim signal generator 330 may generate and output the trim signals trim<n:1> so that the resistance value of the variable resistance circuit 214 is increased at operation S1150. Accordingly, the resistance value of the variable resistance circuit 214 may be increased, and a procedure starting from the above-described operation S1070 may be re-performed.

When, as a result of the comparison at operation S1130, the first fail bit count Fail_bit_a is greater than or equal to the second fail bit count Fail_bit_b (in case of Yes), the trim signal generator 330 may generate and output the trim signals trim<n:1> so that the resistance value of the variable resistance circuit 214 is maintained.

In accordance with the embodiment of the present disclosure, the number of fail bits, which is detected depending on the result of performing a test program operation and a test read operation based on the internal voltage, is compared with the number of fail bits, which is detected depending on the result of performing a test program operation and a test read operation based on the external voltage, and the resistance value of the variable resistance circuit is set based on the result of the comparison. Accordingly, the operating characteristics of the memory device may be improved when the overall operation of the memory device is performed using the external voltage.

Figure 11:
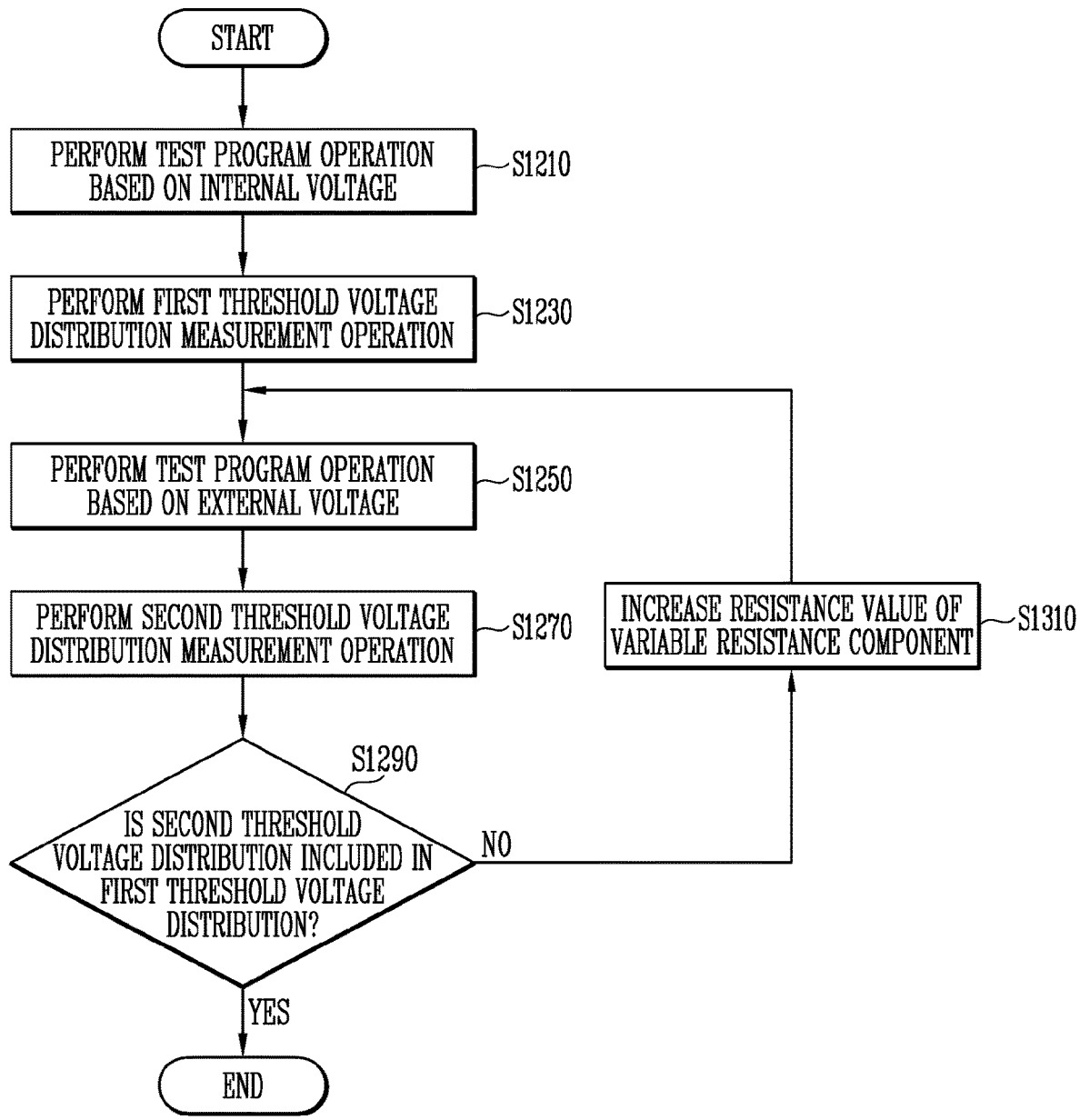
FIG. 11 is a flowchart illustrating a method of operating a memory device according to an embodiment of the present disclosure.

FIG. 11 is a flowchart illustrating a method of operating a memory device according to an embodiment of the present disclosure.

Figure 12:
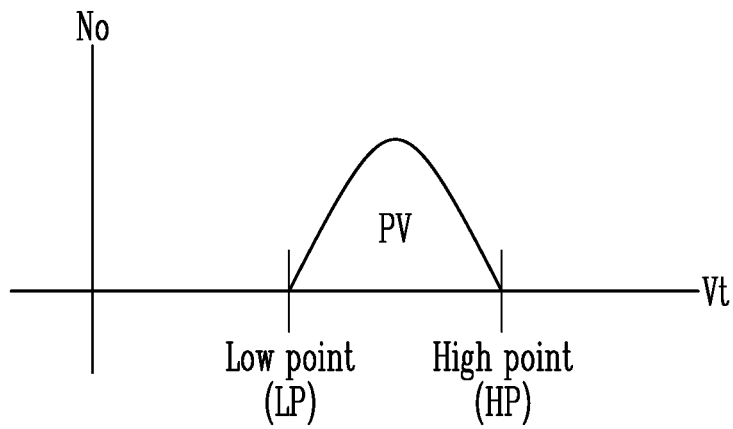
FIG. 12 is a diagram illustrating a threshold voltage distribution in a program state to describe a threshold voltage distribution measurement method.

FIG. 12 is a diagram illustrating a threshold voltage distribution in a program state to describe a threshold voltage distribution measurement method.

A method of operating a memory device according to the present embodiment of the present disclosure will be described with reference to FIGS. 2 to 8, 11, and 12.

At operation S1210, the control logic 300 may control the peripheral circuits 200 so that a test program operation is performed based on an internal voltage.

For example, the internal voltage generator 211 of the voltage generation circuit 210 may be activated to generate and output the internal voltage Vint under the control of the control logic 300. The selector 212 may receive the internal voltage Vint from the internal voltage generator 211, and may select the internal voltage Vint and output it to the regulator 213 in response to a mode signal. The regulator 213 may generate operating voltages Vop using the received internal voltage Vint and output the operating voltages Vop to the row decoder 220.

During a test program operation, the page buffers PB1 to PBm of the read/write circuit 230 may receive and temporarily store program data having a preset pattern or a random pattern, and may control the potential levels of the corresponding bit lines BL1 to BLm based on the temporarily stored program data.

The row decoder 220 may transfer the operating voltages Vop to the local lines LL coupled to the selected memory block (e.g., MB1) in response to a row address RADD. For example, among the operating voltages Vop, the program voltage may be applied to a selected word line, and the pass voltage may be applied to unselected word lines, and thus the test program operation may be performed.

The test program operation may be performed on at least one page selected from the selected memory block (e.g., MB1). As a result of the test program operation, memory cells included in the at least one selected page may be programmed to at least one program state PV.

At operation S1230, the control logic 300 may control the peripheral circuits 200 so that a first threshold voltage distribution measurement operation is performed.

For example, the control logic 300 controls the peripheral circuits 200 so that, during the first threshold voltage distribution measurement operation, a low point (LP), which is the threshold voltage of a memory cell having the lowest threshold voltage, among memory cells on which the test program operation has been performed, and a high point (HP), which is the threshold voltage of a memory cell having the highest threshold voltage, are detected.

For example, the voltage generation circuit 210 may generate and output the plurality of operating voltages Vop including a verify voltage using the internal voltage Vint. The row decoder 220 may transfer the operating voltages Vop to the local lines LL coupled to the selected memory block (e.g., MB1) in response to a row address RADD. For example, among the operating voltages Vop, the verify voltage may be applied to a selected word line, and a pass voltage may be applied to unselected word lines.

The page buffers PB1 to PBm of the read/write circuit 230 may detect verify data by sensing the potential levels or amounts of current of the bit lines BL1 to BLm. When memory cells having threshold voltages lower than the verify voltage are detected based on the read verify data, the control logic 200 may reset the verify voltage by decreasing the verify voltage by a preset step voltage, and may control the peripheral circuits 200 so that the above-described verify operation is re-performed. When memory cells having threshold voltages lower than the verify voltage are not detected based on the read verify data, the control logic 200 may detect the verify voltage that was used last as the low point LP of the first threshold voltage distribution.

Also, when the verify operation is performed while the verify voltage is gradually increased similarly to the above-described method, and memory cells having threshold voltages higher than the verify voltage are not detected, the verify voltage that was used last may be detected as the high point HP of the first threshold voltage distribution.

At operation S1250, the control logic 300 may control the peripheral circuits 200 so that a test program operation is performed based on an external voltage.

For example, the voltage generation circuit 210 may generate the plurality of operating voltages Vop using the external voltage Vext and output the operating voltages Vop.

During a test program operation, the page buffers PB1 to PBm of the read/write circuit 230 may receive and temporarily store program data having a preset pattern or a random pattern, and may control the potential levels of the corresponding bit lines BL1 to BLm based on the temporarily stored program data. The program data at operation S1250 may have the same data pattern as the program data at the above-described operation S1210.

The row decoder 220 may transfer the operating voltages Vop to the local lines LL coupled to the selected memory block (e.g., MB1) in response to a row address RADD. For example, among the operating voltages Vop, the program voltage may be applied to a selected word line, and the pass voltage may be applied to unselected word lines, and thus the test program operation may be performed.

The test program operation may be performed on at least one page selected from the selected memory block (e.g., MB1). As a result of the test program operation, memory cells included in the at least one selected page may be programmed to at least one program state PV.

At operation S1270, the control logic 300 may control the peripheral circuits 200 so that a second threshold voltage distribution measurement operation is performed.

The second threshold voltage distribution measurement operation may be performed similarly to the first threshold voltage distribution measurement operation. That is, during the second threshold voltage distribution measurement operation, the low point LP and the high point HP of the second threshold voltage distribution may be detected.

At operation S1290, the control logic 300 may determine whether the second threshold voltage distribution is included in the first threshold voltage distribution.

For example, when the high point HP of the second threshold voltage distribution is lower than or equal to the high point HP of the first threshold voltage distribution, the control logic 300 may determine that the second threshold voltage distribution is included in the first threshold voltage distribution, whereas when the high point HP of the second threshold voltage distribution is higher than the high point HP of the first threshold voltage distribution, the control logic 300 may determine that the second threshold voltage distribution is not included in the first threshold voltage distribution.

In an embodiment, when the low point LP of the second threshold voltage distribution is equal to or high than the lower point LP of the first threshold voltage distribution, and that the high point HP of the second threshold voltage distribution is lower than or equal to the high point HP of the first threshold voltage distribution, the control logic 300 may determine that the second threshold voltage distribution is included in the first threshold voltage distribution. In contrast, when the low point LP of the second threshold voltage distribution is lower than the lower point LP of the first threshold voltage distribution, or when the high point HP of the second threshold voltage distribution is higher than the high point HP of the first threshold voltage distribution, the control logic 300 may determine that the second threshold voltage distribution is not included in the first threshold voltage distribution.

When the second threshold voltage distribution is included in the first threshold voltage distribution (in case of Yes) at the above-described operation S1290, the trim signal generator 330 may generate and output the trim signals trim<n:1> so that the resistance value of the variable resistance circuit 214 is maintained.

When the second threshold voltage distribution is not included in the first threshold voltage distribution (in case of No) at the above-described operation S1290, the trim signal generator 330 may generate and output the trim signals trim<n:1> so that the resistance value of the variable resistance circuit 214 is increased at operation S1310. Accordingly, the resistance value of the variable resistance circuit 214 may be increased, and a procedure starting from the above-described operation S1250 may be re-performed.

Figure 13:
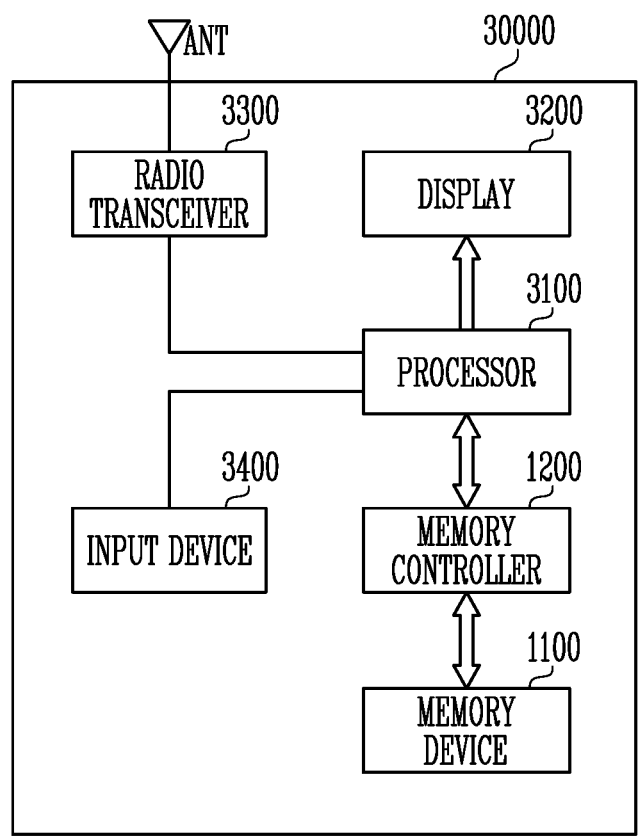
FIG. 13 is a diagram illustrating an embodiment of a memory system having the memory device of FIG. 2.

FIG. 13 is a diagram illustrating an embodiment of a memory system having the memory device of FIG. 2.

Referring to FIG. 13, a memory system 30000 may be implemented as a cellular phone, a smartphone, a tablet PC, a personal digital assistant (PDA) or a wireless communication device. The memory system 30000 may include a memory device 1100 (e.g., memory device 1100 of FIG. 1) and a memory controller 1200 (e.g., memory controller 1200 of FIG. 1) that is capable of controlling the operation of the memory device 1100. The memory controller 1200 may control a data access operation of the memory device 1100, for example, a program operation, an erase operation, or a read operation, under the control of a processor 3100.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad, a computer mouse, a keypad, or a keyboard. The processor 3100 may control the operation of the display 3200 so that data output from the memory controller 1200, data output from the radio transceiver 3300, or data output from the input device 3400 is output via the display 3200.

In an embodiment, the memory controller 1200 capable of controlling the operation of the memory device 1100 may be implemented as a part of the processor 3100 or as a chip provided separately from the processor 3100.

Figure 14:
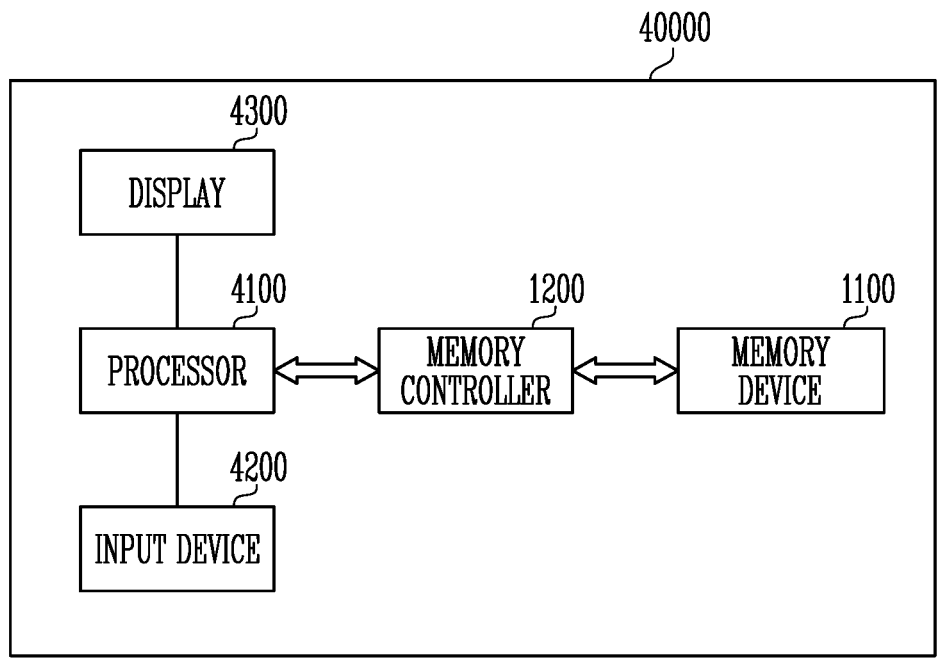
FIG. 14 is a diagram illustrating an embodiment of a memory system having the memory device of FIG. 2.

FIG. 14 is a diagram illustrating an embodiment of a memory system having the memory device of FIG. 2.

Referring to FIG. 14, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 (e.g., memory device 1100 of FIG. 1) and a memory controller 1200 (e.g., memory controller 1200 of FIG. 1) that is capable of controlling a data processing operation of the memory device 1100.

A processor 4100 may output data, stored in the memory device 1100, via a display 4300 according to data input through an input device 4200. For example, the input device 4200 may be implemented as a pointing device such as a touch pad, a computer mouse, a keypad, or a keyboard.

The processor 4100 may control the overall operation of the memory system 40000, and may control the operation of the memory controller 1200. In an embodiment, the memory controller 1200 capable of controlling the operation of the memory device 1100 may be implemented as a part of the processor 4100 or as a chip provided separately from the processor 4100.

Figure 15:
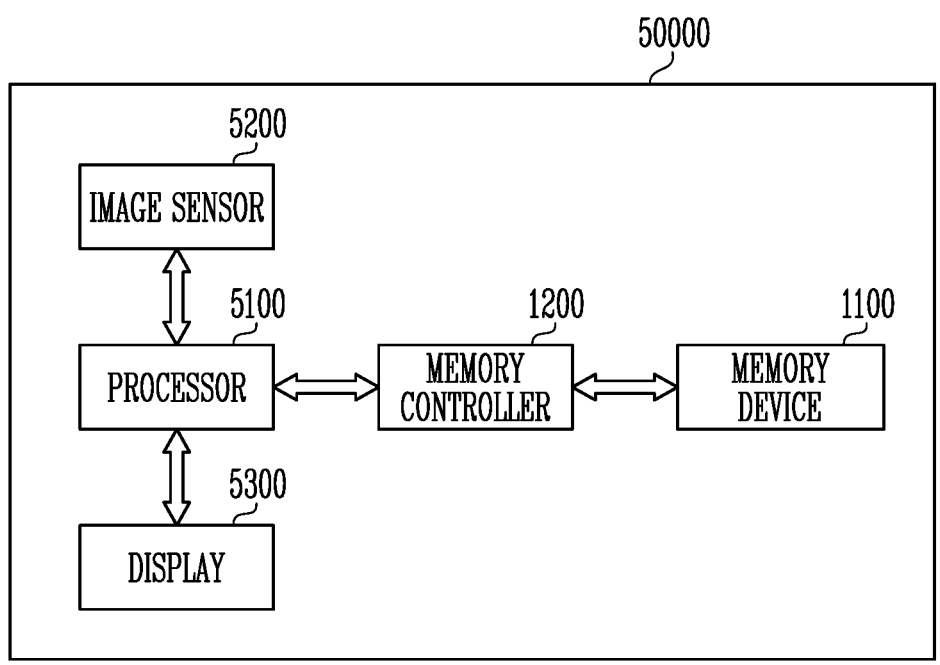
FIG. 15 is a diagram illustrating an embodiment of a memory system having the memory device of FIG. 2.

FIG. 15 is a diagram illustrating an embodiment of a memory system having the memory device of FIG. 2.

Referring to FIG. 15, a memory system 50000 may be implemented as an image processing device, e.g., a digital camera, a mobile phone provided with a digital camera, a smartphone provided with a digital camera, or a tablet PC provided with a digital camera.

The memory system 50000 may include a memory device 1100 (e.g., memory device 1100 of FIG. 1) and a memory controller 1200 (e.g., memory controller 1200 of FIG. 1) that is capable of controlling a data processing operation for the memory device 1100, for example, a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output via a display 5300 or may be stored in the memory device 1100 through the memory controller 1200. Further, data stored in the memory device 1100 may be output via the display 5300 under the control of the processor 5100 or the memory controller 1200.

In an embodiment, the memory controller 1200 capable of controlling the operation of the memory device 1100 may be implemented as a part of the processor 5100 or as a chip provided separately from the processor 5100.

Figure 16:
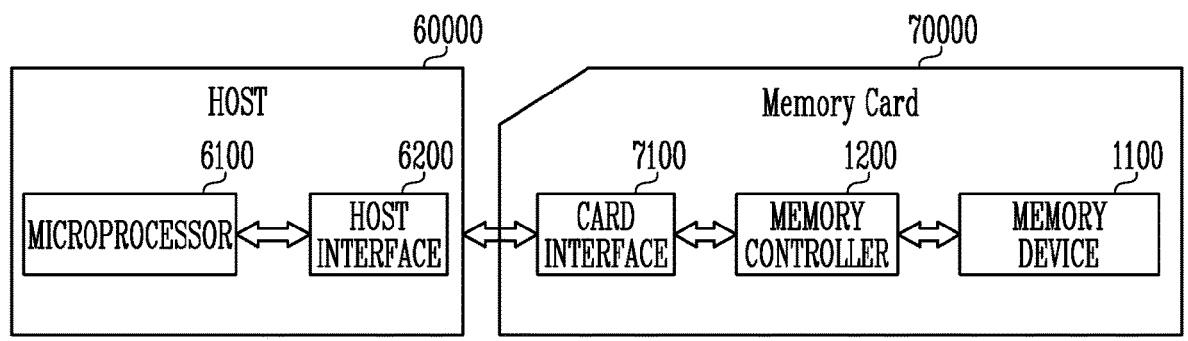
FIG. 16 is a diagram illustrating an embodiment of a memory system having the memory device of FIG. 2.

FIG. 16 is a diagram illustrating an embodiment of a memory system having the memory device of FIG. 2.

Referring to FIG. 16, a memory system 70000 may be implemented as a memory card or a smart card. The memory system 70000 may include a memory device 1100 (e.g., memory device 1100 of FIG. 1), a memory controller 1200 (e.g., memory controller 1200 of FIG. 1), and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface.

Further, the card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the memory controller 1200 under the control of a microprocessor 6100.

The present disclosure adjusts the time during which an operating voltage rises when an operation of generating the operating voltage using an external voltage is performed, thus improving the reliability of a memory device.

Further, the present disclosure may check cell characteristics by performing a test operation based on an operating voltage generated using an external voltage, thus improving the reliability of a memory device.

While the various embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A memory device, comprising:
a memory block;
a voltage generation circuit configured to operate in a first mode in which an operating voltage is generated using an internal voltage or a second mode in which the operating voltage is generated using an external voltage, and to provide the operating voltage to the memory block; and
a control logic configured to measure and store a first rising time during which the operating voltage rises to a target level in the first mode, and to control the voltage generation circuit so that a second rising time during which the operating voltage rises to the target level in the second mode is equal to or longer than the first rising time.

2. The memory device according to claim 1, wherein the voltage generation circuit comprises:
an internal voltage generator configured to generate the internal voltage;
a variable resistance circuit configured to receive the external voltage from an external device and then output an input external voltage, wherein an amount of output current is controlled based on a preset resistance value; and
a selector configured to output the internal voltage or the input external voltage in response to a mode signal corresponding to the first mode or the second mode.

3. The memory device according to claim 2, wherein the variable resistance circuit varies the resistance value in response to a plurality of trim signals.

4. The memory device according to claim 3, wherein the control logic is configured to, when the second rising time is shorter than the first rising time, generate and output the plurality of trim signals for increasing the resistance value of the variable resistance circuit.

5. The memory device according to claim 4, wherein the control logic comprises:
a rising time measurement circuit configured to receive the operating voltage in the first mode and measure the first rising time during which the operating voltage rises to the target level, and to receive the operating voltage in the second mode and measure the second rising time during which the operating voltage rises to the target level;
a first register configured to store the first rising time measured by the rising time measurement circuit; and
a trim signal generator configured to compare the first rising time stored in the first register with the second rising time measured by the rising time measurement circuit, and generate the plurality of trim signals based on a result of the comparison.

6. The memory device according to claim 5, wherein the trim signal generator generates the plurality of trim signals based on a difference between the first rising time and the second rising time.

7. The memory device according to claim 3, further comprising:
a read/write circuit coupled to the memory block and configured to perform a test program operation and a test read operation; and
a fail bit counter configured to count a number of fail bits in read data that is read as a result of the test read operation and then generate a fail bit count.

8. The memory device according to claim 7, wherein the control logic is configured to:
control the voltage generation circuit so that the operating voltage generated in the first mode is provided to the memory block,
control the read/write circuit so that, in the first mode, the test program operation and the test read operation are performed,
control the fail bit counter so that, in the first mode, the number of fail bits in the read data is counted and then a first fail bit count is generated, and
receive and store the first fail bit count.

9. The memory device according to claim 8, wherein the control logic is configured to:

control the voltage generation circuit so that the operating voltage generated in the second mode is provided to the memory block,
control the read/write circuit so that, in the second mode, the test program operation and the test read operation are performed,
control the fail bit counter so that, in the second mode, the number of fail bits in the read data is counted and then a second fail bit count is generated, and
generate the plurality of trim signals by comparing the first fail bit count with the second fail bit count.

10. The memory device according to claim 9, wherein the control logic comprises:
a second register configured to store the first fail bit count; and
a trim signal generator configured to generate the plurality of trim signals by comparing the first fail bit count stored in the second register with the second fail bit count received from the fail bit counter.

11. The memory device according to claim 10, wherein the trim signal generator is configured to, when the second fail bit count is greater than the first fail bit count, generate and output the plurality of trim signals for increasing the resistance value of the variable resistance circuit.

12. The memory device according to claim 11, wherein the control logic is configured to, after the plurality of trim signals have been generated and output,
control the voltage generation circuit and the read/write circuit so that, in the second mode, the test program operation and the test read operation are re-performed, and
after the test read operation has been re-performed, receive the second fail bit count from the fail bit counter, and re-perform a comparison operation of comparing the second fail bit count with the first fail bit count.

13. The memory device according to claim 3, wherein:
the variable resistance circuit comprises a plurality of switches coupled in parallel between an input terminal configured to receive the external voltage and an output terminal configured to output the input external voltage, and
wherein the plurality of switches have different resistance values, and each of the switches performs a switching operation in response to any one of the plurality of trim signals.

14. A method of operating a memory device, comprising:
performing a first mode operation of generating an operating voltage using an internal voltage;
measuring a first rising time during which the operating voltage rises to a target level, during the first mode operation;
performing a second mode operation of generating the operating voltage using an external voltage;
measuring a second rising time during which the operating voltage rises to the target level, during the second mode operation; and
comparing the first rising time with the second rising time, and
maintaining or increasing the second rising time based on a result of the comparison.

15. The method according to claim 14, wherein the second mode operation comprises:
receiving the external voltage and outputting the external voltage as an input external voltage, wherein an amount of current of the input external voltage is controlled by adjusting a resistance value of a reception circuit; and
generating the operating voltage using the input external voltage.

16. The method according to claim 15, wherein the increasing of the second rising time includes increasing the resistance value of the reception circuit.

17. A method of operating a memory device, comprising:
performing a first mode operation of generating an operating voltage using an internal voltage;
performing a test program operation and a test read operation, during the first mode operation;
counting a number of fail bits in first read data that is read as a result of the test read operation and then generating a first fail bit count, during the first mode operation;
performing a second mode operation of generating the operating voltage using an external voltage;
performing the test program operation and the test read operation, during the second mode operation;
counting a number of fail bits in second read data that is read as a result of the test read operation and then generating a second fail bit count, during the second mode operation; and
comparing the first fail bit count with the second fail bit count, and
adjusting a resistance value of a reception circuit configured to receive the external voltage in the second mode operation based on a result of the comparison.

18. The method according to claim 17, wherein the second mode operation comprises:
receiving the external voltage and outputting the external voltage as an input external voltage, wherein an amount of current of the input external voltage is controlled by adjusting a resistance value of the reception circuit; and
generating the operating voltage using the input external voltage.

19. The method according to claim 18,
wherein the adjusting includes, when the second fail bit count is greater than the first fail bit count, increasing the resistance value, and
further comprising repeating, with the increased resistance value, the performing of the test program operation and the test read operation and the counting of the number during the second mode operation and the comparing and adjusting.

20. The method according to claim 18, wherein the adjusting includes, when the second fail bit count is less than or equal to the first fail bit count, maintaining the resistance value.

21. A method of operating a memory device, comprising:
performing a first test program operation using an internal voltage;
measuring a first threshold voltage distribution of memory cells on which the first test program operation has been performed;
performing a second test program operation using an external voltage;
measuring a second threshold voltage distribution of memory cells on which the second test program operation has been performed;
comparing the first threshold voltage distribution with the second threshold voltage distribution; and
adjusting a resistance value of a reception circuit configured to receive the external voltage based on a result of the comparison.

22. The method according to claim 21, wherein the measuring of the first threshold voltage distribution includes detecting a low point and a high point of the threshold voltage distribution of the memory cells on which the first test program operation has been performed.

23. The method according to claim 22, wherein the measuring of the second threshold voltage distribution includes detecting a low point and a high point of the threshold voltage distribution of the memory cells on which the second test program operation has been performed.

24. The method according to claim 23, wherein the comparing of the first threshold voltage distribution with the second threshold voltage distribution includes determining whether the second threshold voltage distribution is included in the first threshold voltage distribution.

25. The method according to claim 24, wherein the comparing of the first threshold voltage distribution with the second threshold voltage distribution includes determining whether the high point of the second threshold voltage distribution is lower than or equal to the high point of the first threshold voltage distribution.

26. The method according to claim 24,
wherein the adjusting includes, when the second threshold voltage distribution is not included in the first threshold voltage distribution as a result of the comparison, increasing the resistance value, and
further comprising repeating, with the increased resistance value, the performing of the second test program operation, the measuring of the second threshold voltage distribution, the comparing and the adjusting.

27. The method according to claim 24, wherein the adjusting includes, when the second threshold voltage distribution is included in the first threshold voltage distribution as a result of the comparison, maintaining the resistance value.

* * * * *